(12) United States Patent
Takemasa et al.

(10) Patent No.: US 12,219,702 B2
(45) Date of Patent: Feb. 4, 2025

(54) WIRING SUBSTRATE AND DISPLAY DEVICE

(71) Applicant: Japan Display Inc., Tokyo (JP)

(72) Inventors: Kenichi Takemasa, Tokyo (JP); Yasushi Nakano, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 225 days.

(21) Appl. No.: 17/941,761

(22) Filed: Sep. 9, 2022

(65) Prior Publication Data

US 2023/0007770 A1 Jan. 5, 2023

Related U.S. Application Data

(63) Continuation of application No. PCT/JP2021/001597, filed on Jan. 19, 2021.

(30) Foreign Application Priority Data

Mar. 24, 2020 (JP) .................................. 2020-052849

(51) Int. Cl.
*H05K 1/11* (2006.01)
(52) U.S. Cl.
CPC .... *H05K 1/111* (2013.01); *H05K 2201/10106* (2013.01); *H05K 2201/10128* (2013.01)
(58) Field of Classification Search
CPC ......... H05K 1/111; H05K 2201/10106; H05K 2201/10128
USPC ....................................................... 361/767
See application file for complete search history.

(56) References Cited

U.S. PATENT DOCUMENTS

| | | |
|---|---|---|
| 2013/0248916 A1 | 9/2013 | Suehiro et al. |
| 2017/0213502 A1 | 7/2017 | Henry et al. |
| 2018/0145236 A1 | 5/2018 | Huang et al. |
| 2020/0083415 A1 | 3/2020 | Kim et al. |
| 2020/0126477 A1 | 4/2020 | Henry et al. |
| 2020/0271979 A1* | 8/2020 | Roh ........................ H01L 24/05 |
| 2021/0082892 A1 | 3/2021 | Kanaya et al. |
| 2021/0217356 A1 | 7/2021 | Henry et al. |
| 2021/0265282 A1 | 8/2021 | Li |

(Continued)

FOREIGN PATENT DOCUMENTS

| | | |
|---|---|---|
| CN | 110190085 A | 8/2019 |
| JP | 2013-225646 A | 10/2013 |

(Continued)

OTHER PUBLICATIONS

International Search Report issued in International Patent Application No. PCT/JP2021/001597 on Apr. 6, 2021 and English translation of same. 5 pages.

(Continued)

*Primary Examiner* — Binh B Tran
(74) *Attorney, Agent, or Firm* — K&L Gates LLP

(57) ABSTRACT

A wiring substrate includes a substrate, an insulating film stacked on the substrate, an anode pad stacked on a first surface of the insulating film and electrically coupled to an anode of an inorganic light-emitting diode, a cathode pad stacked on the first surface of the insulating film and electrically coupled to a cathode of the inorganic light-emitting diode, and an auxiliary pad provided to the first surface of the insulating film and having electrical conductivity. The auxiliary pad is disposed in a floating state near an end of the anode pad and the cathode pad.

10 Claims, 13 Drawing Sheets

(56) References Cited

U.S. PATENT DOCUMENTS

2022/0148495 A1  5/2022  Henry et al.
2023/0057723 A1* 2/2023  Li .......................... H01L 25/167

FOREIGN PATENT DOCUMENTS

| JP | 2017-529557 A | 10/2017 |
| WO | WO2011/129313 A1 | 10/2011 |
| WO | WO2019/230260 A1 | 12/2019 |

OTHER PUBLICATIONS

Written Opinion issued in International Patent Application No. PCT/JP2021/001597 on Apr. 6, 2021. 4 pages.

* cited by examiner

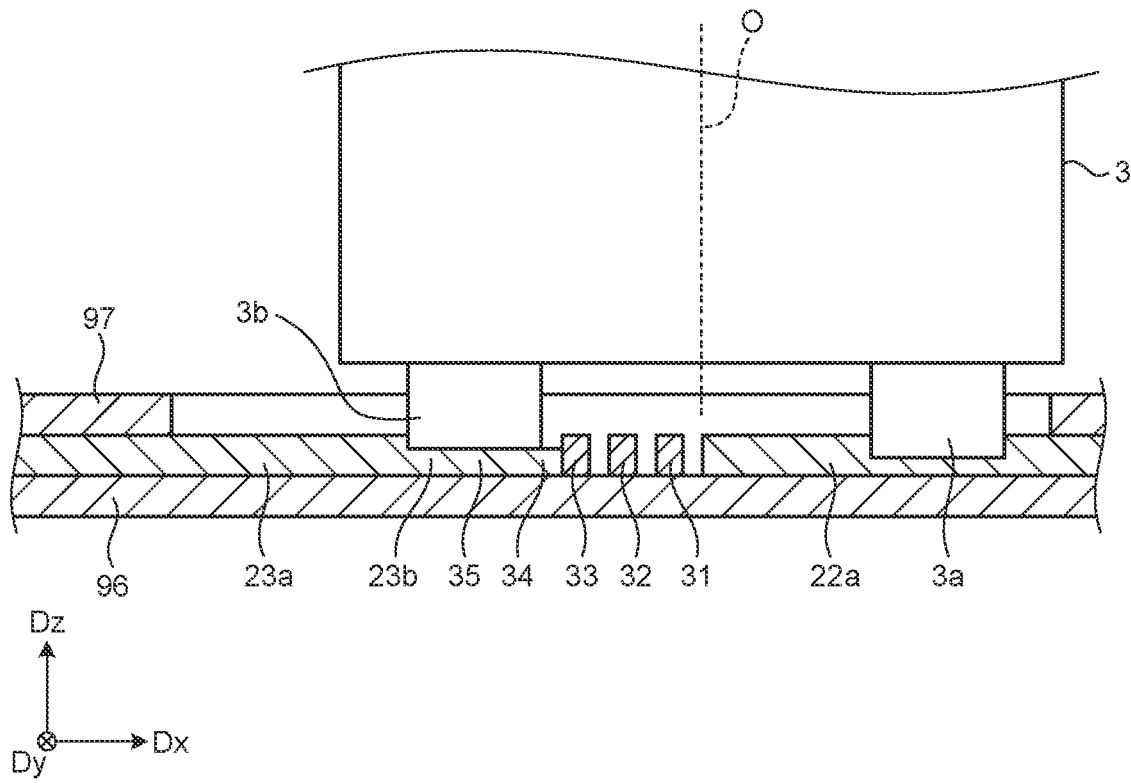
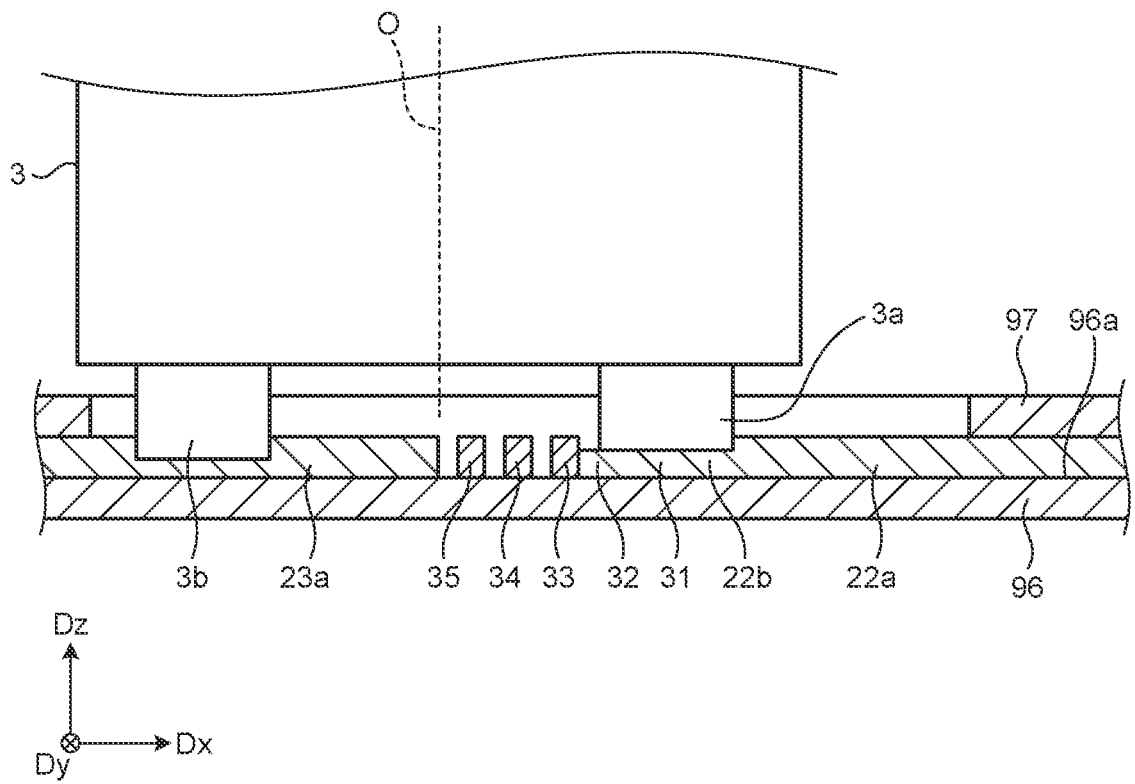

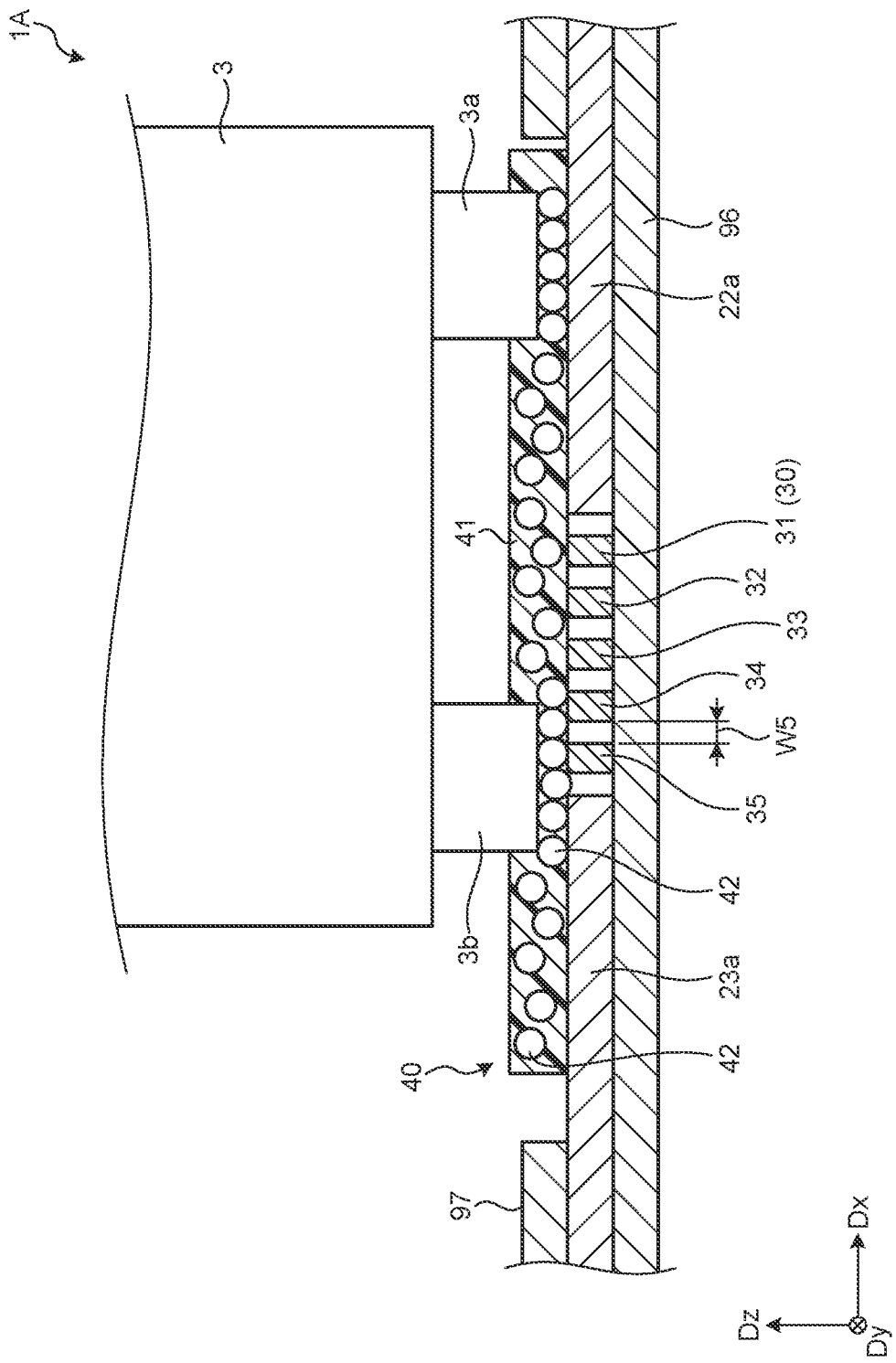

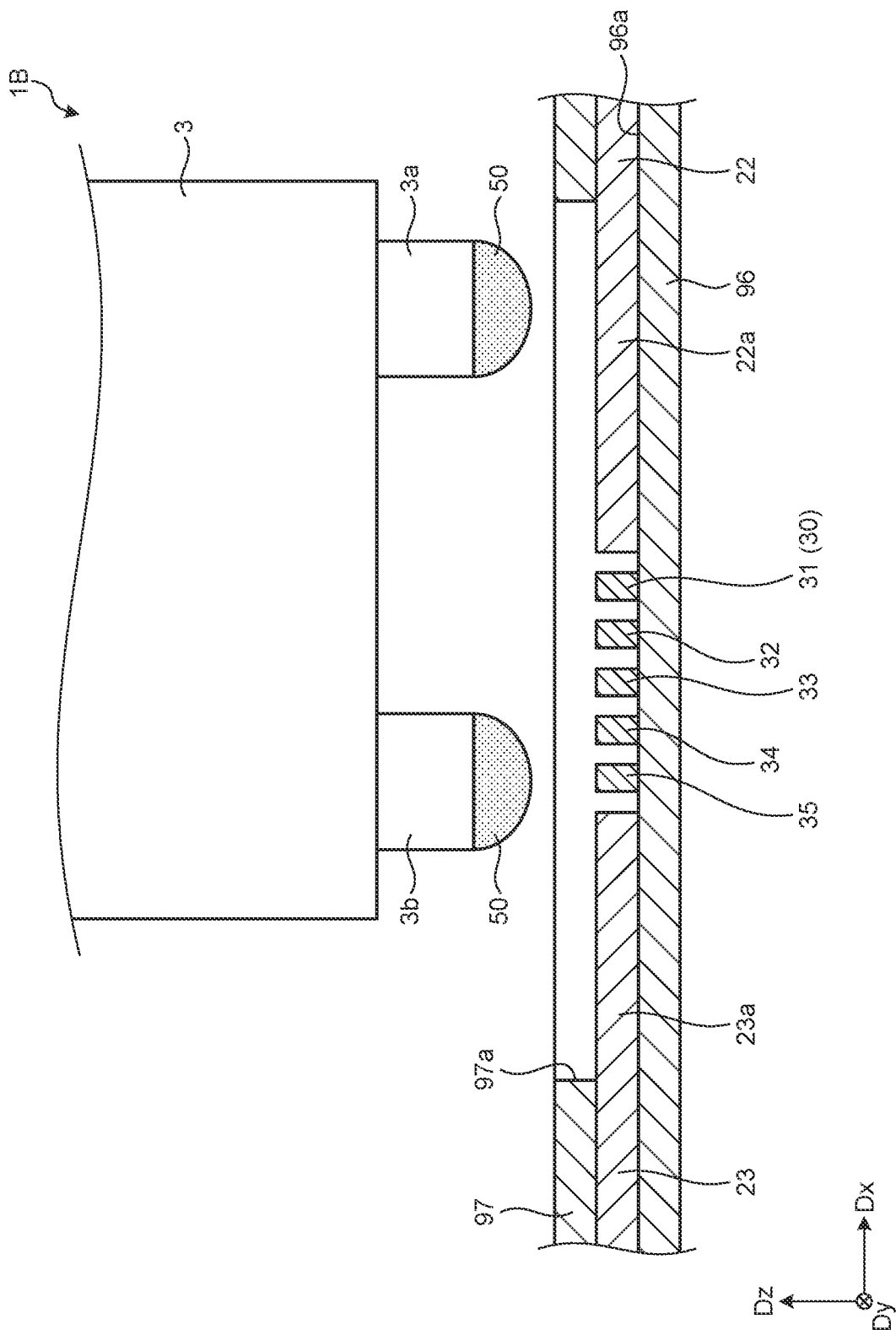

WIRING SUBSTRATE AND DISPLAY DEVICE

CROSS-REFERENCE TO RELATED APPLICATION

This application is a continuation of International Patent Application No. PCT/JP2021/001597 filed on Jan. 19, 2021 which designates the United States, incorporated herein by reference, and which claims the benefit of priority from Japanese Patent Application No. 2020-052849 filed on Mar. 24, 2020, incorporated herein by reference.

BACKGROUND

1. Technical Field

The present disclosure relates to a wiring substrate and a display device.

2. Description of the Related Art

Widely known are various display devices, including inorganic EL displays provided with inorganic light-emitting diodes (mini-LEDs or micro-LEDs) as described in Japanese Translation of PCT International Application Publication No. 2017-529557. Inorganic EL displays include an array substrate serving as a wiring substrate in which thin-film transistors (TFTs) are arrayed. As described in the specification of US Patent Application Publication No. 2018/0145236 and the specification of CN Patent Application Publication No. 110190085, the array substrate includes pads (electrodes) to which the anode and the cathode of the inorganic light-emitting diode are bonded. Thus, the anode, the cathode, and the pads constitute a coupling part for coupling the array substrate and the inorganic light-emitting diode.

If the mounting position of the inorganic light-emitting diode is misaligned with respect to the wiring substrate (array substrate), the contact area of the anode or the cathode with the pad is reduced. This results in increased resistance of the coupling part and is not desirable. In particular, small-sized parts, such as mini-LEDs and micro-LEDs, have a small tolerance for misalignment and are likely to lead to an increase in resistance of the coupling part.

An object of the present disclosure is to provide a wiring substrate and a display device that can suppress an increase in resistance of a coupling part if the mounting position of an inorganic light-emitting diode is misaligned with respect to a predetermined position.

SUMMARY

A wiring substrate according to an embodiment of the present disclosure includes a substrate, an insulating film stacked on the substrate, an anode pad stacked on a first surface of the insulating film and electrically coupled to an anode of an inorganic light-emitting diode, a cathode pad stacked on the first surface of the insulating film and electrically coupled to a cathode of the inorganic light-emitting diode, and an auxiliary pad provided to the first surface of the insulating film and having electrical conductivity. The auxiliary pad is disposed in a floating state near an end of the anode pad and the cathode pad.

A display device according to an embodiment of the present disclosure includes the wiring substrate, and an inorganic light-emitting diode bonded by pressing the anode and the cathode against the anode pad and the cathode pad that are melted. The auxiliary pad has a bulge coupled to the anode pad or the cathode pad disposed adjacently to the auxiliary pad in the planar direction or coupled to another auxiliary pad disposed adjacently to the auxiliary pad in the planar direction.

A display device according to an embodiment of the present disclosure includes the wiring substrate, an anisotropic conductive film including a plurality of metal particles and stacked over the anode pad, the cathode pad, and the auxiliary pad, and an anode of an inorganic light-emitting diode bonded by pressing the anode and the cathode against the anisotropic conductive film that is melted. The inorganic light-emitting diode is electrically coupled to the anode pad, the cathode pad, and the auxiliary pad via the metal particles, and the auxiliary pad is electrically coupled to the anode pad and the cathode pad via the metal particles.

BRIEF DESCRIPTION OF THE DRAWINGS

FIG. 7 is a view of a case where the light-emitting element is mounted with its center in a first direction misaligned closer to a first pad;

FIG. 8 is a view of a case where the light-emitting element is mounted with its center in the first direction misaligned closer to a second pad;

FIG. 9 is an enlarged view of the coupling part between the array substrate and the light-emitting element in the display device according to a second embodiment;

FIG. 10 is an enlarged view of a state where the light-emitting element is yet to be bonded to the array substrate in the display device according to a third embodiment;

DETAILED DESCRIPTION

Figure 1:
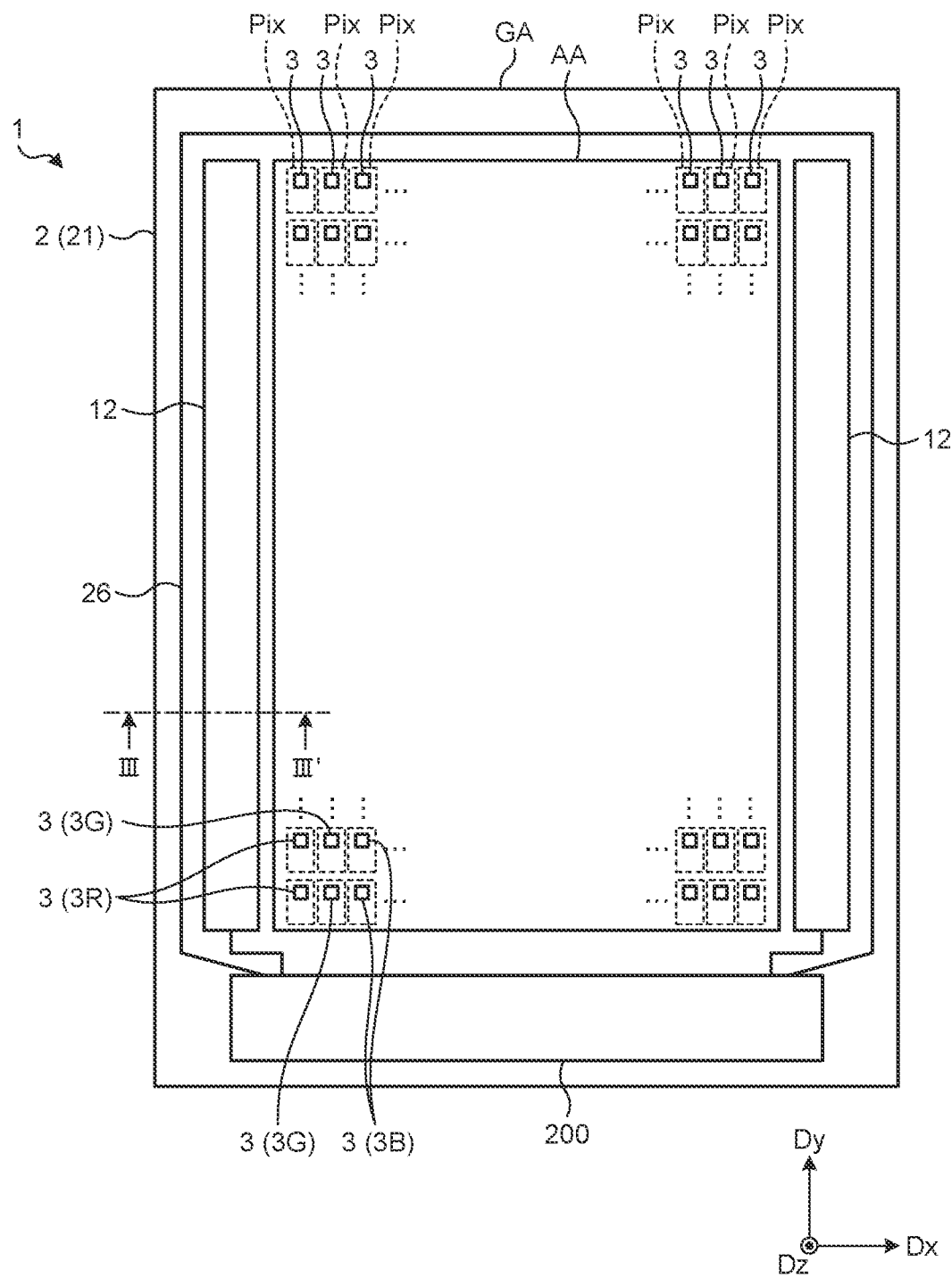
FIG. 1 is a plan view schematically illustrating a display device according to a first embodiment.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by like reference numerals, and detailed explanation thereof may be appropriately omitted.

First Embodiment

FIG. 1 is a plan view schematically illustrating a display device according to a first embodiment. As illustrated in FIG. 1, a display device 1 includes an array substrate 2, a plurality of pixels Pix, drive circuits 12, a drive integrated circuit (IC) 200, and cathode wiring 26. The array substrate 2 is a wiring substrate for driving the pixels Pix. The array substrate 2 is also called a backplane or an active matrix substrate. The wiring substrate according to the present disclosure is not limited to the array substrate 2. The array substrate 2 includes a substrate 21, first transistors Tr1, second transistors Tr2, transistors TrG (refer to FIG. 4), and various kinds of wiring, for example. The first transistor Tr1, the second transistor Tr2, and the like are switching elements provided to each pixel Pix. The transistor TrG is a switching element included in the drive circuits 12.

As illustrated in FIG. 1, the display device 1 has a display region AA and a peripheral region GA. The display region AA is positioned overlapping the pixels Pix and displays an image. The peripheral region GA does not overlap the pixels Pix and is positioned outside the display region AA.

The pixels Pix are arrayed in a first direction Dx and a second direction Dy in the display region AA of the substrate 21. The first direction Dx and the second direction Dy are parallel to the surface of the substrate 21. The direction parallel to the plane including the first direction Dx and the second direction Dy may be referred to as a planar direction. The first direction Dx is orthogonal to the second direction Dy. Therefore, the second direction Dy may be referred to as an orthogonal direction. The first direction Dx may intersect the second direction Dy without being orthogonal thereto. A third direction Dz is orthogonal to the first direction Dx and the second direction Dy and may be referred to as a stacking direction.

The drive circuit 12 is a circuit that drives a plurality of gate lines based on various control signals from the drive IC 200. The gate lines include a first gate line GCL1 and a second gate line GCL2 illustrated in FIG. 2. The drive circuits 12 sequentially or simultaneously select a plurality of gate lines and supply gate drive signals to the selected gate lines. Thus, the drive circuits 12 select the pixels Pix coupled to the gate lines.

The drive IC 200 is a circuit that controls display on the display device 1. The drive IC 200 is mounted on the peripheral region GA of the substrate 21 as chip on glass (COG). The configuration is not limited thereto, and the drive IC 200 may be mounted on a flexible printed circuit board or a rigid circuit board coupled to the peripheral region GA of the substrate 21 as chip on film (COF).

The cathode wiring 26 is provided in the peripheral region GA of the substrate 21. The cathode wiring 26 is provided surrounding the pixels Pix in the display region AA and the drive circuits 12 in the peripheral region GA. Cathodes of a plurality of light-emitting elements 3 are coupled to the common cathode wiring 26 and are supplied with a ground potential, for example.

Each pixel Pix includes a light-emitting element 3. The light-emitting elements 3 are provided corresponding to the respective pixels Pix and include a first light-emitting element 3R, a second light-emitting element 3G, and a third light-emitting element 3B that output light in different colors. The first light-emitting element 3R outputs red light. The second light-emitting element 3G outputs green light. The third light-emitting element 3B outputs blue light. In the following explanation, the first light-emitting element 3R, the second light-emitting element 3G, and the third light-emitting element 3B are simply referred to as the light-emitting elements 3 when they need not be distinguished from one another. The pixels Pix may include four or more light-emitting elements 3 and output different light in four or more colors.

In the array of the pixels Pix, the pixel Pix including the first light-emitting element 3R, the pixel Pix including the second light-emitting element 3G, and the pixel Pix including the third light-emitting element 3B are repeatedly arrayed in this order in the first direction Dx. In other words, the first light-emitting element 3R, the second light-emitting element 3G, and the third light-emitting element 3B are repeatedly arrayed in this order in the first direction Dx. The first light-emitting elements 3R, the second light-emitting elements 3G, and the third light-emitting elements 3B are each arrayed in the second direction Dy.

The light-emitting element 3 is an inorganic light-emitting diode (LED) chip having a size of approximately 3 μm to 300 μm in planar view and is called a micro-LED. A display device including micro-LEDs in the respective pixels is also called a micro-LED display device. The term "micro" of the micro-LED is not intended to limit the size of the inorganic light-emitting diode. The light-emitting element 3 may be a mini-LED.

Figure 2:
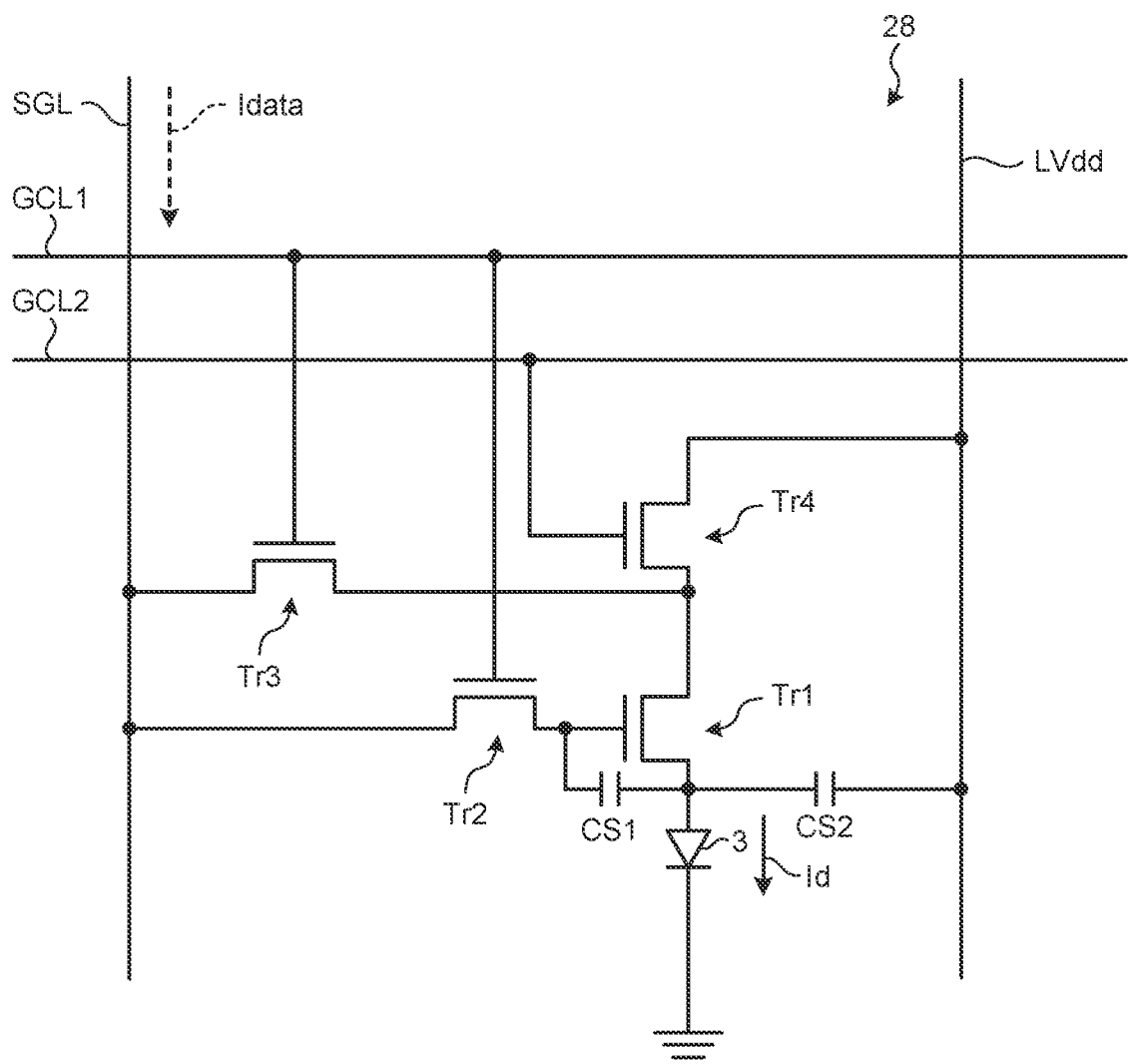
FIG. 2 is a circuit diagram of a pixel circuit of the display device.

FIG. 2 is a circuit diagram of a pixel circuit of the display device. A pixel circuit 28 is a drive circuit that drives the light-emitting element 3. As illustrated in FIG. 2, the pixel circuit 28 includes a plurality of switching elements (the first transistor Tr1, the second transistor Tr2, a third transistor Tr3, and a fourth transistor Tr4), the first gate line GCL1, the second gate line GCL2, a signal line SGL, and a power supply line LVdd. Each transistor is a thin-film transistor (TFT).

The first transistor Tr1 is a TFT for driving. The second transistor Tr2 is a TFT for switching between an emitting period and a non-emitting period. The third transistor Tr3 and the fourth transistor Tr4 are TFTs for switching an electric current. The signal line SGL is coupled to a constant current source. The power supply line LVdd is coupled to a constant voltage source.

Holding capacitance CS1 is formed between the drain of the second transistor Tr2 and the anode of the light-emitting element 3. Holding capacitance CS2 is formed between the anode of the light-emitting element 3 and the power supply line LVdd. With the holding capacitance CS1 and the holding capacitance CS2, the pixel circuit 28 suppresses fluctuations in the gate voltage due to parasitic capacitance and leakage current in the second transistor Tr2.

In the non-emitting period, the drive circuits 12 (refer to FIG. 1) set the electric potential of the first gate line GCL1 at a high level and set the electric potential of the second gate line GCL2 at a low level. As a result, the second transistor Tr2 and the third transistor Tr3 are turned on, and the fourth transistor Tr4 is turned off. The anode of the light-emitting element 3 is supplied with an electric current Idata from the signal line SGL.

In the emitting period, the drive circuits 12 (refer to FIG. 1) set the electric potential of the first gate line GCL1 at a low level and set the electric potential of the second gate line GCL2 at a high level. As a result, the second transistor Tr2 and the third transistor Tr3 are turned off, and the fourth transistor Tr4 is turned on. The anode of the light-emitting element 3 is supplied with an electric current Id from the constant power supply line LVdd. The configuration illustrated in FIG. 2 is given by way of example only, and the configuration of the pixel circuit 28 and the operation of the display device 1 can be appropriately modified.

Figure 3:
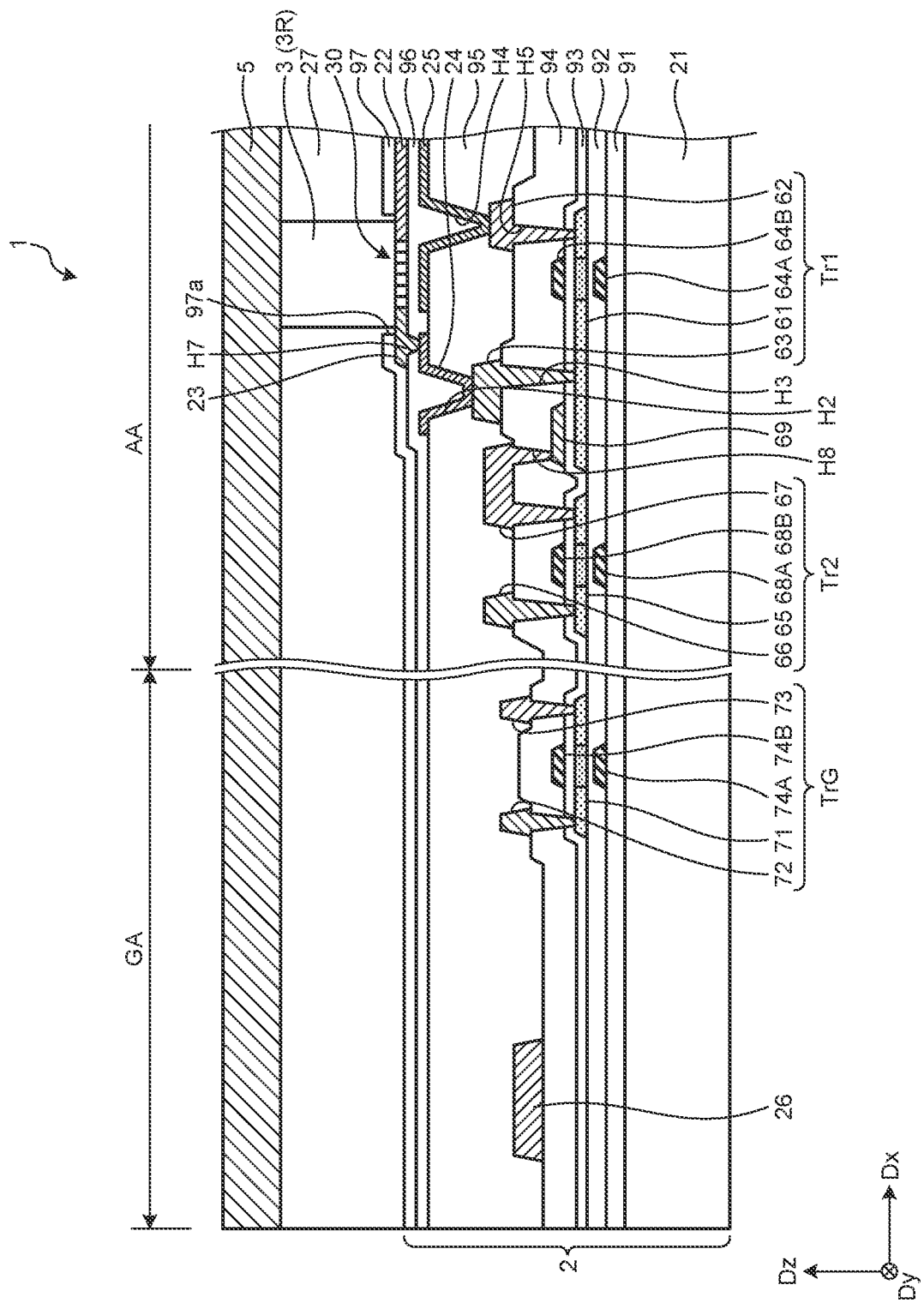
FIG. 3 is a sectional view along line III-III' of FIG. 1.

FIG. 3 is a sectional view along line III-III' of FIG. 1. As illustrated in FIG. 3, the light-emitting element 3 is provided on the array substrate 2. The array substrate 2 includes the substrate 21, switching elements, such as the first transistor Tr1 and the second transistor Tr2, various kinds of wiring, and various kinds of insulating films. In the peripheral region GA of the substrate 21, the transistor TrG included in the drive circuits 12 is provided as a plurality of transistors. The substrate 21 is an insulating substrate and is a glass substrate, a resin substrate, or a resin film, for example.

In the present specification, a direction from the substrate 21 toward an upper surface 27a of a planarization film 27 in a direction perpendicular to the surface of the substrate 21 is referred to as an "upper side". A direction from the upper surface 27a of the planarization film 27 toward the substrate 21 is referred to as a "lower side". The term "plan view" indicates a view seen from a direction perpendicular to the surface of the substrate 21.

The first transistor Tr1, the second transistor Tr2, and the transistor TrG are provided on one surface of the substrate 21. The first transistor Tr1 includes a semiconductor 61, a source electrode 62, a drain electrode 63, a first gate electrode 64A, and a second gate electrode 64B. The first gate electrode 64A is provided on the substrate 21 with a first insulating film 91 interposed therebetween. Insulating films, such as the first insulating film 91, are made of inorganic insulating material, such as a silicon oxide film (SiO), a silicon nitride film (SiN), and a silicon oxynitride film (SiON). Each inorganic insulating film is not limited to a single layer and may be a multilayered film.

A second insulating film 92 is provided on the first insulating film 91 to cover the first gate electrode 64A. The semiconductor 61 is provided on the second insulating film 92. A third insulating film 93 is provided on the second insulating film 92 to cover the semiconductor 61. The second gate electrode 64B is provided on the third insulating film 93. The semiconductor 61 is provided between the first gate electrode 64A and the second gate electrode 64B in the third direction Dz. In the semiconductor 61, a channel region is formed at a part sandwiched between the first gate electrode 64A and the second gate electrode 64B.

In the example illustrated in FIG. 3, the first transistor Tr1 has what is called a dual-gate structure. The first transistor Tr1, however, may have a bottom-gate structure provided not with the second gate electrode 64B but with the first gate electrode 64A alone or a top-gate structure provided not with the first gate electrode 64A but with the second gate electrode 64B alone.

The semiconductor 61 is made of amorphous silicon, microcrystalline oxide semiconductor, amorphous oxide semiconductor, polycrystalline silicon, low-temperature polycrystalline silicon (LTPS), or gallium nitride (GaN), for example. Examples of the oxide semiconductor include, but are not limited to, IGZO, zinc oxide (ZnO), ITZO, etc. IGZO is indium gallium zinc oxide. ITZO is indium tin zinc oxide.

A fourth insulating film 94 is provided on the third insulating film 93 to cover the second gate electrode 64B. The source electrode 62 and the drain electrode 63 are provided on the fourth insulating film 94. In the configuration according to the present embodiment, the source electrode 62 is electrically coupled to the semiconductor 61 through a contact hole H5. The drain electrode 63 is electrically coupled to the semiconductor 61 through a contact hole H3.

A fifth insulating film 95 is provided on the fourth insulating film 94 to cover the source electrode 62 and the drain electrode 63. The fifth insulating film 95 is a planarization film that planarizes recesses and protrusions formed by the first transistor Tr1 and various kinds of wiring.

The second transistor Tr2 includes a semiconductor 65, a source electrode 66, a drain electrode 67, a first gate electrode 68A, and a second gate electrode 68B. The second transistor Tr2 has a layer structure similar to that of the first transistor Tr1, and detailed description thereof is omitted. The drain electrode 67 of the second transistor Tr2 is electrically coupled to coupling wiring 69 through a contact hole H8. The coupling wiring 69 is coupled to the first gate electrode 64A and the second gate electrode 64B of the first transistor Tr1.

While the semiconductor 65, the source electrode 66, the drain electrode 67, the first gate electrode 68A, and the second gate electrode 68B are provided in the same layers as those of the semiconductor 61, the source electrode 62, the drain electrode 63, the first gate electrode 64A, and the second gate electrode 64B of the first transistor Tr1, respectively, they may be provided in different layers.

The transistor TrG includes a semiconductor 71, a source electrode 72, a drain electrode 73, a first gate electrode 74A, and a second gate electrode 74B. The transistor TrG is a switching element included in the drive circuits 12. The transistor TrG also has a layer structure similar to that of the first transistor Tr1, and a detailed description thereof is omitted. The third transistor Tr3 and the fourth transistor Tr4 (refer to FIG. 2) also have a layer structure similar to that of the first transistor Tr1.

Figure 4:
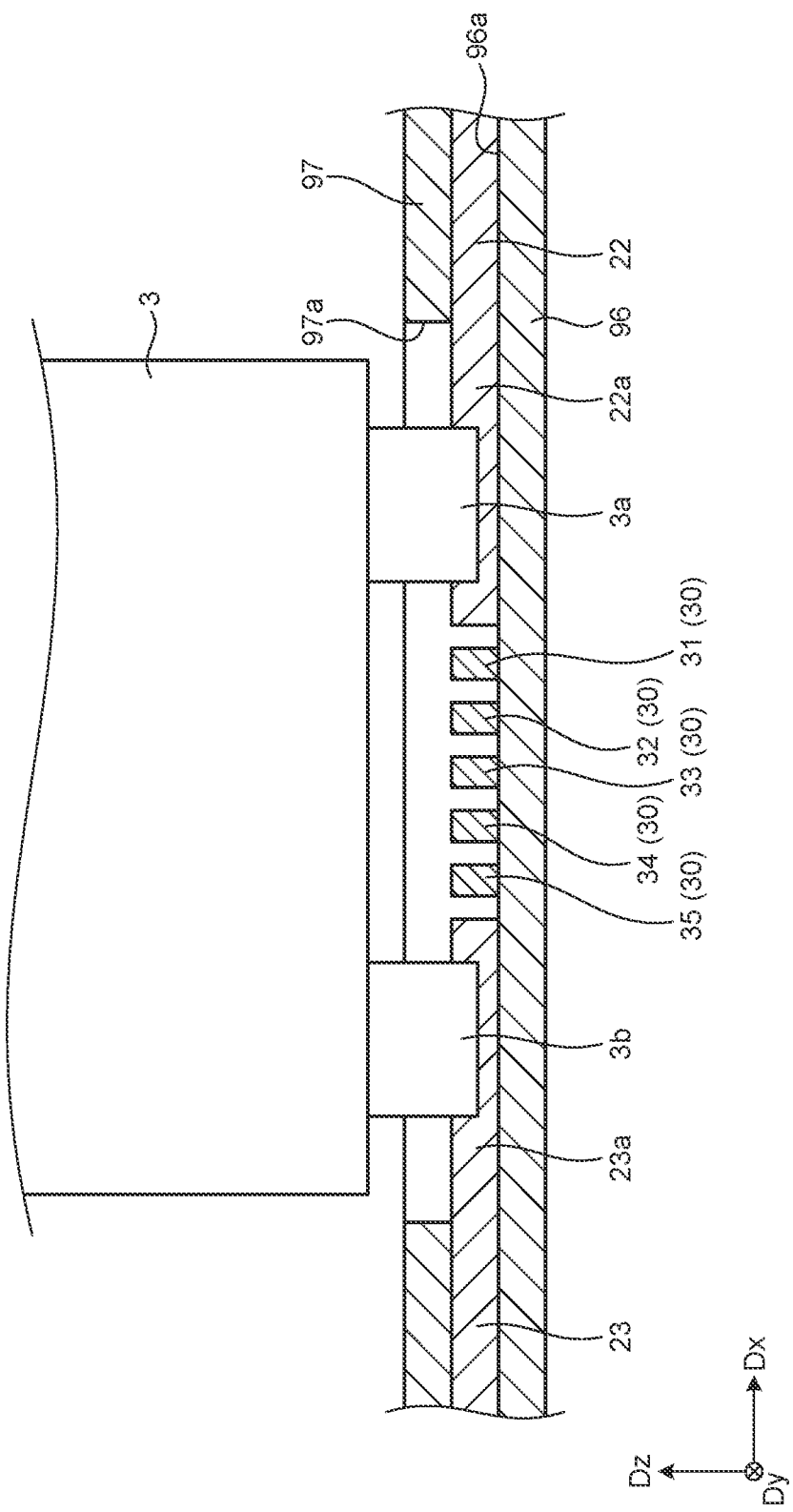
FIG. 4 is an enlarged view of a coupling part between an array substrate and a light-emitting element.

FIG. 4 is an enlarged view of a coupling part between the array substrate and the light-emitting element. The light-emitting element 3 includes a light-emitting layer composed of an n-type cladding layer, an active layer, and a p-type cladding layer stacked in order and is made of compound semiconductor, such as gallium nitride (GaN) and aluminum indium phosphorus (AlInP). As illustrated in FIG. 4, the light-emitting element 3 has what is called a face-down structure in which a cathode 3a coupled to the n-type cladding layer and an anode 3b coupled to the p-type cladding layer are provided at the lower part. The light-emitting element 3 may be made of a known LED chip.

As illustrated in FIG. 3, the array substrate 2 includes a first electrode 22, a second electrode 23, a third electrode 24, a fourth electrode 25, and a plurality of auxiliary pads 30.

The first electrode 22 and the second electrode 23 are provided between the substrate 21 and the light-emitting element 3. The first electrode 22 is provided on a first surface 96a of a sixth insulating film 96 and is electrically coupled to the cathode wiring 26 (refer to FIG. 1) provided in the peripheral region GA. As illustrated in FIG. 4, the first electrode 22 is coupled to the cathode 3a of the light-emitting element 3. The first electrode 22 includes a first pad 22a as an electrode bonded to the cathode 3a of the light-emitting element 3. The first pad 22a is bonded to the cathode 3a of the light-emitting element 3 by welding. In other words, the first pad 22a is heated and melted by a laser device or the like in bonding. Subsequently, the end of the cathode 3a of the light-emitting element 3 is thrust into and bonded to the melted first pad 22a. The first pad 22a may be referred to as a cathode pad.

The second electrode 23 is coupled to the anode 3b of the light-emitting element 3. The second electrode 23 includes a second pad 23a as an electrode bonded to the anode 3b of the light-emitting element 3. Similarly to the cathode 3a, the second pad 23a is bonded to the anode 3b of the light-emitting element 3 by welding. The second pad 23a may be referred to as an anode pad. The second electrode 23 is provided on the first surface 96a of the sixth insulating film 96. As illustrated in FIG. 3, the second electrode 23 is coupled to the third electrode 24 through a contact hole H7.

The third electrode 24 is provided on the fifth insulating film 95 and is electrically coupled to the drain electrode 63 through a contact hole H2. Thus, the second electrode 23 and the third electrode 24 couples the anode of the light-emitting element 3 to the drain electrode 63 of the first transistor Tr1. The fourth electrode 25 is provided in the same layer as that of the third electrode 24 and is electrically coupled to the source electrode 62 through a contact hole H4.

The fourth electrode 25 extends on the fifth insulating film 95 and faces the first electrode 22 with the sixth insulating film 96 interposed therebetween in the third direction Dz. As a result, capacitance is formed between the first electrode 22 and the fourth electrode 25. The capacitance formed between the first electrode 22 and the fourth electrode 25 is used as the holding capacitance CS in the pixel circuit 28.

A seventh insulating film 97 is provided on the first electrode 22, the second electrode 23, and the sixth insulating film 96. The seventh insulating film 97 has an opening 97a through which the first electrode 22 and the second electrodes 23 can be coupled to the light-emitting element 3.

The planarization film 27 is provided on the seventh insulating film 97. The planarization film 27 is provided from the display region AA to the peripheral region GA. The planarization film 27 is a translucent organic insulating film and is made of resin material, such as silicone resin, epoxy resin, acrylic resin, and polyimide resin. A cover 5 made of a light-transmitting member, such as glass, is provided on the planarization film 27.

As illustrated in FIG. 4, the auxiliary pads 30 are made of conductive material and have electrical conductivity. The auxiliary pads 30 according to the present embodiment are made of metal material that melts by being heated by a laser device or the like. The auxiliary pads 30 are provided on the first surface 96a of the sixth insulating film 96. The auxiliary pads 30 are disposed between the first pad 22a and the second pad 23a and near the ends of the first pad 22a and the second pad 23a. Being disposed near the ends of the first pad 22a and the second pad 23a means being disposed in the range exposed from the opening 97a of the seventh insulating film 97 and being separated from the ends of the first pad 22a and the second pad 23a to such an extent that electrical insulation from the first pad 22a and the second pad 23a can be secured. If the auxiliary pads 30 are not exposed from the opening 97a of the seventh insulating film 97, the anode 3b and other components fail to be electrically coupled to the auxiliary pads 30 when the light-emitting element 3 is mounted on the array substrate 2.

Figure 5:
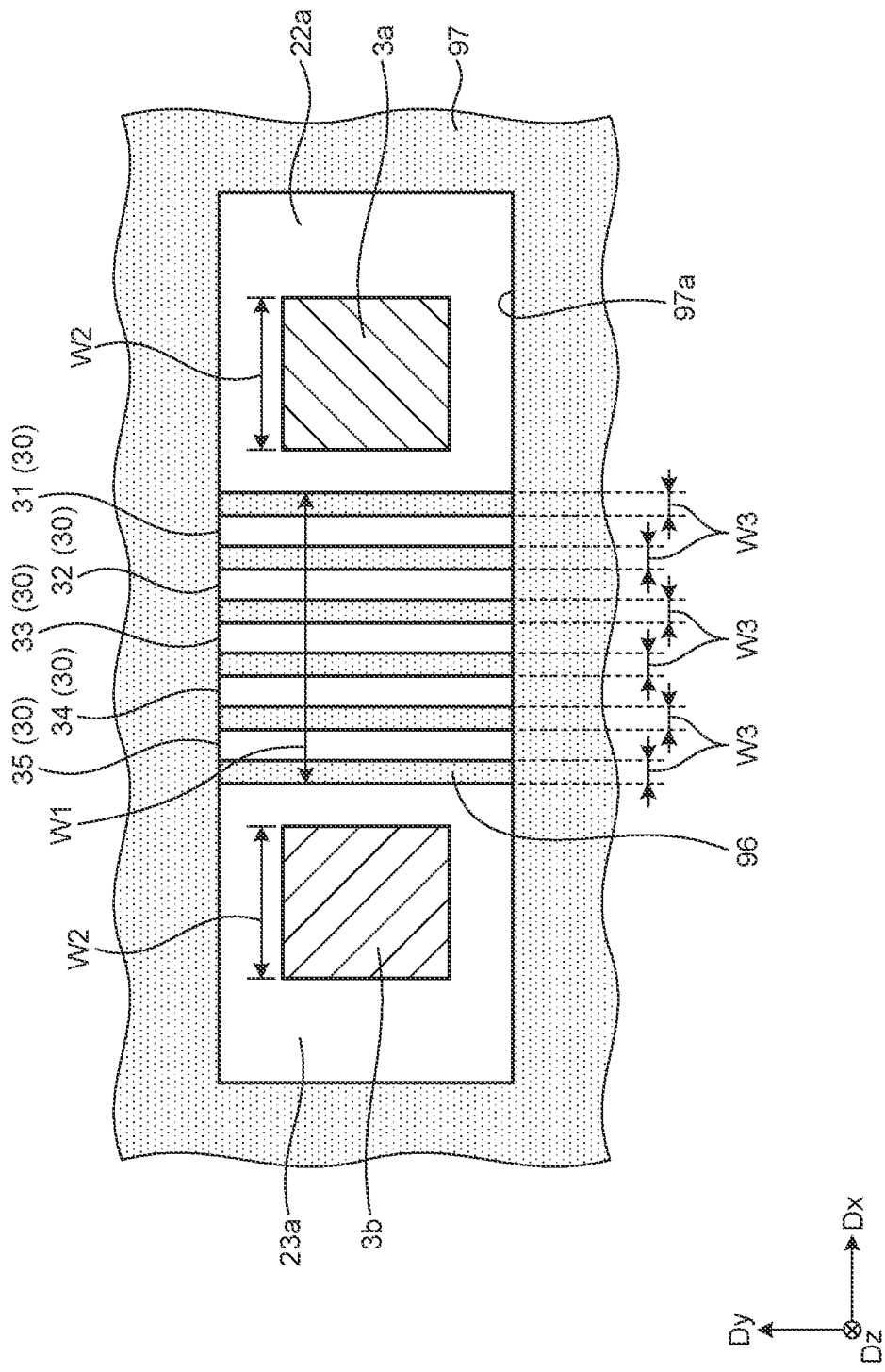
FIG. 5 is a plan view of FIG. 4.

FIG. 5 is a plan view of FIG. 4. As illustrated in FIG. 5, a distance W1 between the first pad 22a and the second pad 23a is larger than a width W2 of the cathode 3a and the anode 3b of the light-emitting element 3 in the first direction Dx. This configuration can prevent the cathode 3a or the anode 3b from being coupled to both the first pad 22a and the second pad 23a across them if the mounting position of the light-emitting element 3 is misaligned in the first direction Dx.

Five auxiliary pads 30 are provided. Each auxiliary pad 30 has a rectangular shape longer in the second direction Dy than in the first direction Dx when viewed from the third direction Dz. Each auxiliary pad 30 has an island shape and is electrically floating in the process before the light-emitting element 3 is mounted. The five auxiliary pads 30 are arrayed in the first direction Dx with a space W3 interposed therebetween. In the following description, the five auxiliary pads 30 may be referred to as a first auxiliary pad 31, a second auxiliary pad 32, a third auxiliary pad 33, a fourth auxiliary pad 34, and a fifth auxiliary pad 35 in order from the first pad 22a to the second pad 23a as necessary. To describe properties common to the first auxiliary pad 31, the second auxiliary pad 32, the third auxiliary pad 33, the fourth auxiliary pad 34, and the fifth auxiliary pad 35, they are collectively referred to as the auxiliary pads 30.

The first pad 22a and the first auxiliary pad 31 are separated in the first direction Dx. The space between the first pad 22a and the first auxiliary pad 31 is W3, which is equal to the space between the five auxiliary pads 30. Similarly, the second pad 23a and the fifth auxiliary pad 35 are separated in the first direction Dx. The space between the second pad 23a and the fifth auxiliary pad 35 is W3. Thus, all the spaces between the first pad 22a, the first auxiliary pad 31, the second auxiliary pad 32, the third auxiliary pad 33, the fourth auxiliary pad 34, the fifth auxiliary pad 35, and the second pad 23a in the first direction Dx are W3 and equal to one another.

Figure 6:
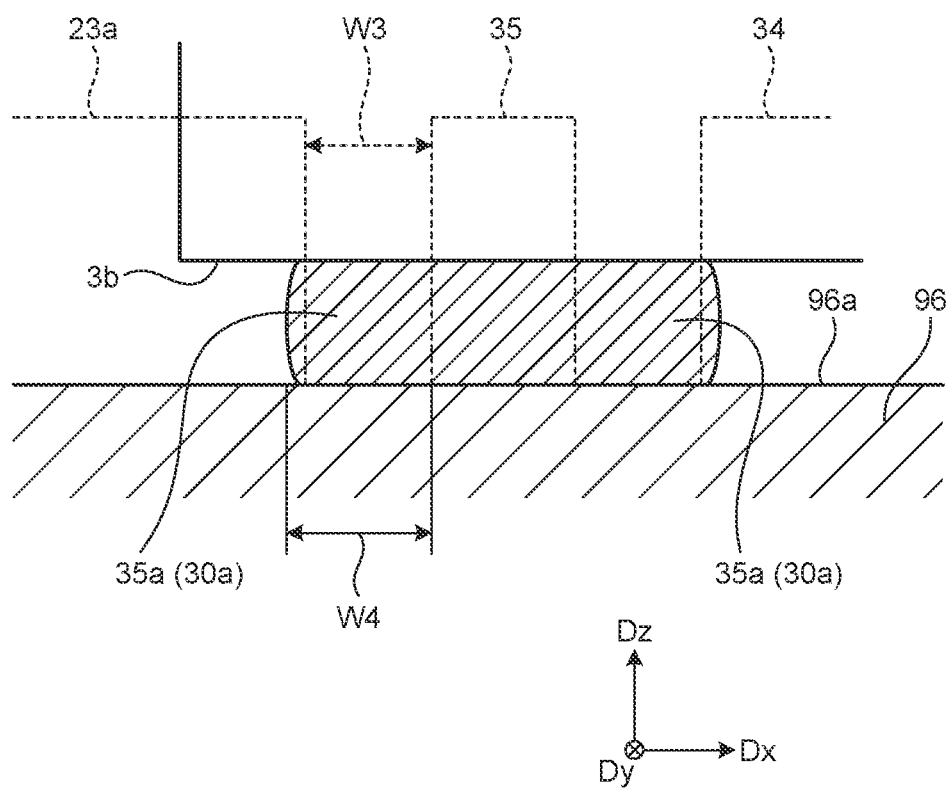
FIG. 6 is a view of a state where a fifth auxiliary pad according to the first embodiment is crushed by an anode 3b.

FIG. 6 is a view of a state where the fifth auxiliary pad according to the first embodiment is crushed by the anode 3b. To mount the light-emitting element 3 on the array substrate 2, the auxiliary pads 30 are heated and melted by a laser device or the like. If the mounting position of the light-emitting element 3 is misaligned in the first direction Dx as illustrated in FIG. 6, the auxiliary pad 30 (refer to the fifth auxiliary pad 35 in FIG. 6) may possibly be crushed by the cathode 3a or the anode 3b. The light-emitting element 3 illustrated in FIGS. 4 and 5 is not misaligned. When crushed by the cathode 3a or the anode 3b, the auxiliary pads 30 expand in the first direction Dx because there are gaps therebetween in the first direction Dx. Therefore, the auxiliary pad 30 has a bulge 30a (refer to a bulge 35a in FIG. 6) that expands in the first direction Dx due to misalignment of the light-emitting element 3.

A first expansion amount of the bulge 30a (refer to the bulge 35a in FIG. 6) in the first direction Dx is W4. The expansion amount indicates the amount of expansion in one direction of the first direction Dx with respect to the auxiliary pad 30 before being crushed. By contrast, the space W3 between the first pad 22a, the second pad 23a, and the five auxiliary pads 30 is smaller than the first expansion amount W4. If the bulge 30a is formed on the auxiliary pad 30, the auxiliary pad 30 comes into contact with the first pad 22a, the second pad 23a, or another auxiliary pad 30 disposed adjacently thereto in the first direction Dx.

In the display device 1 described above, the array substrate 2 includes the substrate 21 to the seventh insulating film 97 covering the first electrode 22 and the second electrode 23. The array substrate 2 does not include the planarization film 27, the light-emitting element 3, or the cover 5.

FIG. 7 is a view of a case where the light-emitting element is mounted with its center in the first direction misaligned closer to the first pad. FIG. 8 is a view of a case where the light-emitting element is mounted with its center in the first direction misaligned closer to the second pad. The following describes a case where the light-emitting element 3 mounted on the array substrate 2 is misaligned. As illustrated in FIG. 7, if a center O of the light-emitting element 3 in the first direction Dx comes closer to the first pad 22a, the anode 3b of the light-emitting element 3 crushes the fourth auxiliary pad 34 and the fifth auxiliary pad 35, for example. As a result, the bulge (refer to the bulge 30a in FIG. 6) of the fourth auxiliary pad 34 comes into contact with the third auxiliary pad 33 and the fifth auxiliary pad 35 disposed adjacently thereto. The bulge (refer to FIG. 6) 35a formed on the fifth auxiliary pad 35 comes into contact with the second pad 23a disposed adjacently thereto in the first direction Dx. In addition, the second pad 23a is also crushed by the anode 3b as illustrated in FIG. 7. As a result, the second pad 23a has a bulge 23b that expands toward the fifth auxiliary pad 35 and surely comes into contact with the fifth auxiliary pad 35. Therefore, the part of the anode 3b not in contact with the second pad 23a is electrically coupled to the second pad 23a via the fourth auxiliary pad 34 and the fifth auxiliary pad 35.

By contrast, if the center O of the light-emitting element 3 in the first direction Dx comes closer to the second pad 23a, the cathode 3a of the light-emitting element crushes the first auxiliary pad 31 and the second auxiliary pad 32, for example, as illustrated in FIG. 8. As a result, the bulge (refer to the bulge 30a in FIG. 6) of the second auxiliary pad 32 comes into contact with the first auxiliary pad 31 and the third auxiliary pad 33 disposed adjacently thereto in the first direction Dx. The bulge (refer to the bulge 30a in FIG. 6) of the first auxiliary pad 31 comes into contact with the first pad 22a disposed adjacently thereto in the first direction Dx. In addition, the first pad 22a is also crushed by the cathode 3a as illustrated in FIG. 8. As a result, the first pad 22a has a bulge 22b that expands toward the first auxiliary pad 31 and surely comes into contact with the first auxiliary pad 31. Therefore, the part of the cathode 3a not in contact with the first pad 22a is electrically coupled to the first pad 22a via the first auxiliary pad 31 and the second auxiliary pad 32.

As described above, the display device 1 and the array substrate (wiring substrate) 2 according to the first embodiment suppress an increase in electrical resistance of the coupling part composed of the cathode 3a and the first pad 22a if the mounting position of the light-emitting element 3 is misaligned. The display device 1 and the array substrate 2 also suppress an increase in electrical resistance of the coupling part composed of the anode 3b and the second pad 23a.

While the anode 3b and the cathode 3a according to the first embodiment are bonded to the pads (the first pad 22a and the second pad 23a) by welding, the wiring substrate and the display device according to the present disclosure are not limited thereto. A second embodiment below describes an example where they are bonded using an anisotropic conductive film (ACF). In the following description, the same components as those described in the embodiment above are denoted by like reference numerals, and overlapping explanation thereof is omitted.

Second Embodiment

FIG. 9 is an enlarged view of the coupling part between the array substrate and the light-emitting element in the display device according to the second embodiment. As illustrated in FIG. 9, a display device 1A is different from the display device 1 according to the first embodiment in that it includes an anisotropic conductive film 40. The anisotropic conductive film 40 is disposed over the first pad 22a, the auxiliary pads 30, and the second pad 23a. The spaces between the first pad 22a, the auxiliary pads 30, and the second pad 23a in the first direction Dx according to the second embodiment are W5 and equal to one another.

The anisotropic conductive film 40 includes a plurality of metal particles 42 in a sheet-like thermosetting resin 41 and has electrical conductivity in the third direction Dz. The anisotropic conductive film 40 is placed over the first pad 22a, the auxiliary pads 30, and the second pad 23a before being cured and is welded to the first pad 22a, the auxiliary pads 30, and the second pad 23a. The anode 3b and the cathode 3a of the light-emitting element 3 are thrust into the anisotropic conductive film 40 before it is cured, and the anisotropic conductive film 40 is welded to the anode 3b and the cathode 3a. Some of the metal particles 42 are pressed toward the first pad 22a and the second pad 23a due to the thrusting the anode 3b and the cathode 3a. For clear understanding, dots are marked inside the metal particles 42 pressed by the anode 3b or the cathode 3a in FIG. 9. Therefore, in the display device 1A according to the second embodiment, the parts of the anode 3b and the cathode 3a overlapping the first pad 22a and the second pad 23a when viewed from the third direction Dz are electrically coupled to the first pad 22a and the second pad 23a via the metal particles 42.

In the configuration according to the second embodiment, the space W5 between the first pad 22a, the auxiliary pads 30, and the second pad 23a in the first direction Dx is smaller than the particle diameter of the metal particles 42. If the center of the light-emitting element 3 in the first direction Dx is misaligned closer to the first pad 22a, the metal particles 42 are pressed by the anode 3b and are interposed between the anode 3b and the fourth auxiliary pad 34 and between the anode 3b and the fifth auxiliary pad 35 as illustrated in FIG. 9. In addition, the metal particles 42 are interposed between the fourth auxiliary pad 34 and the fifth auxiliary pad 35 and between the fifth auxiliary pad 35 and the second pad 23a. Therefore, the part of the anode 3b not overlapping the second pad 23a when viewed from the third direction Dz is electrically coupled to the fourth auxiliary pad 34 and the fifth auxiliary pad 35 via the metal particles 42 and is electrically coupled to the second pad 23a. As described above, the second embodiment also suppresses an increase in electrical resistance of the coupling part.

Third Embodiment

Figure 11:
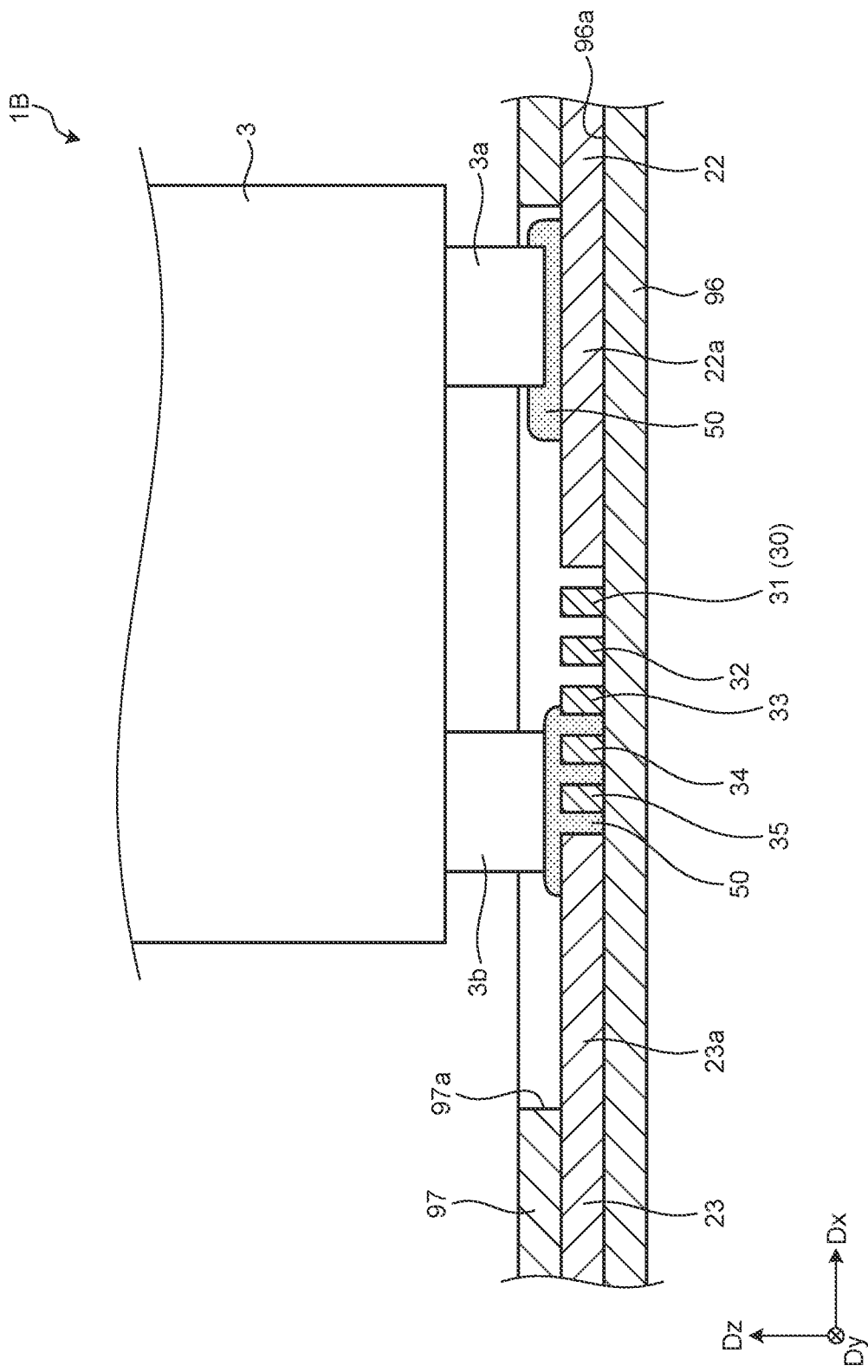
FIG. 11 is an enlarged view of a state where the light-emitting element is bonded to the array substrate in the display device according to the third embodiment.
Figure 16:
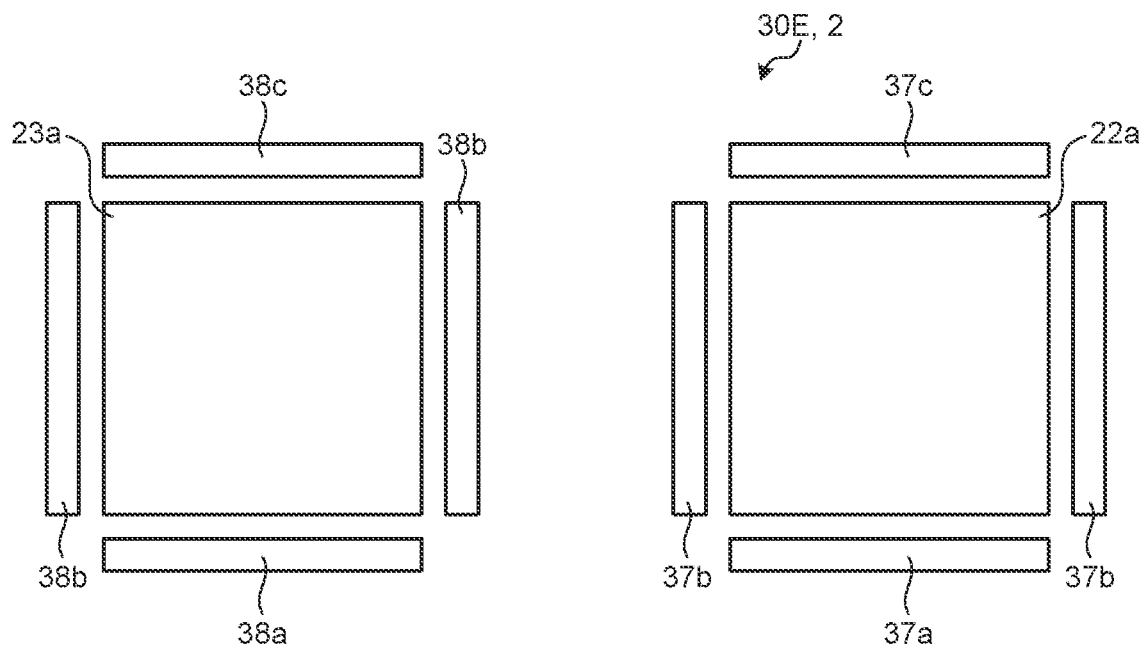
FIG. 16 is a plan view of the auxiliary pads according a fifth modification.
Figure 17:
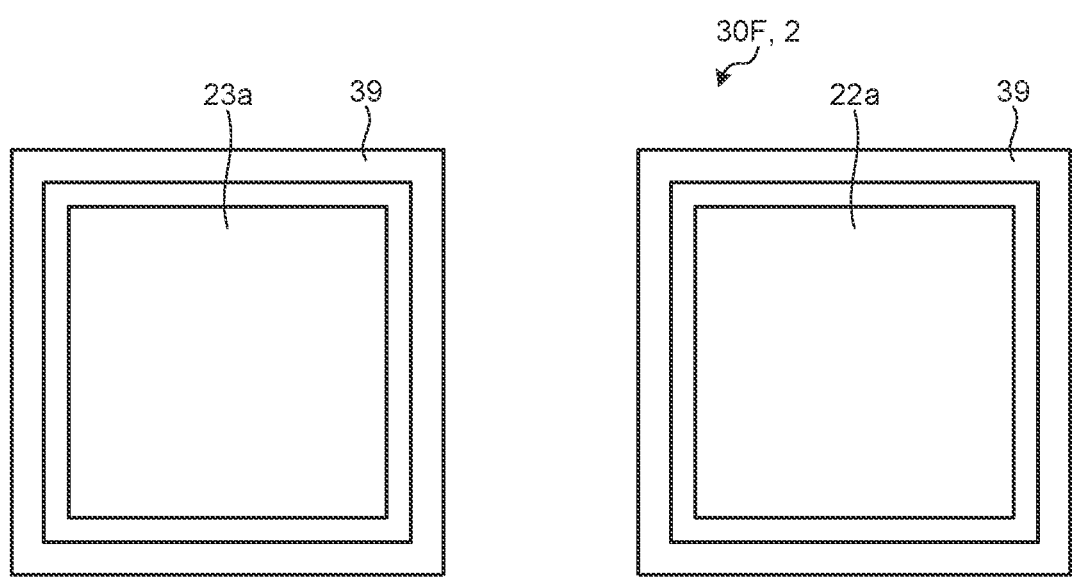
FIG. 17 is a plan view of the auxiliary pads according to a sixth modification.

FIG. 10 is an enlarged view of a state where the light-emitting element is yet to be bonded to the array substrate in the display device according to a third embodiment. FIG. 11 is an enlarged view of a state where the light-emitting element is bonded to the array substrate in the display device according to the third embodiment. As illustrated in FIGS. 16 and 17, a display device 1B according to the third embodiment is different from the display device 1 according to the first embodiment and the display device 1B according to the second embodiment in that it includes a conductive material 50. The conductive material 50 is solder material, such as Sn. The conductive material 50 is welded to the end surfaces of the anode 3b and the cathode 3a of the light-emitting element 3. To mount the light-emitting element 3, the conductive material 50 is heated and melted and adheres to the end surfaces of the anode 3b and the cathode 3a. The anode 3b and the cathode 3a are pressed against the first pad 22a and the second pad 23a while maintaining the melted state of the conductive material 50. When the conductive material 50 hardens, the anode 3b and the cathode 3a are bonded to the first pad 22a and the second pad 23a.

With this configuration, if the center of the light-emitting element 3 in the first direction Dx is misaligned closer to the first pad 22a as illustrated in FIG. 17, the conductive material 50 on the end surface of the anode 3b enters and hardens between the second pad 23a and the fifth auxiliary pad 35, between the fifth auxiliary pad 35 and the fourth auxiliary pad 34, and between the fourth auxiliary pad 34 and the third auxiliary pad 33. Therefore, the part of the anode 3b not overlapping the second pad 23a when viewed from the third direction Dz is electrically coupled to the fourth auxiliary pad 34 and the fifth auxiliary pad 35 via the conductive material 50 and is electrically coupled to the second pad 23a. As described above, the third embodiment also suppresses an increase in electrical resistance of the coupling part.

While the first embodiment, the second embodiment, and the third embodiment have described a plurality of auxiliary pads disposed at equal intervals, for example, the auxiliary pads according to the present disclosure are not limited thereto. The following describes arrangement examples of the auxiliary pads.

First Modification

Figure 12:
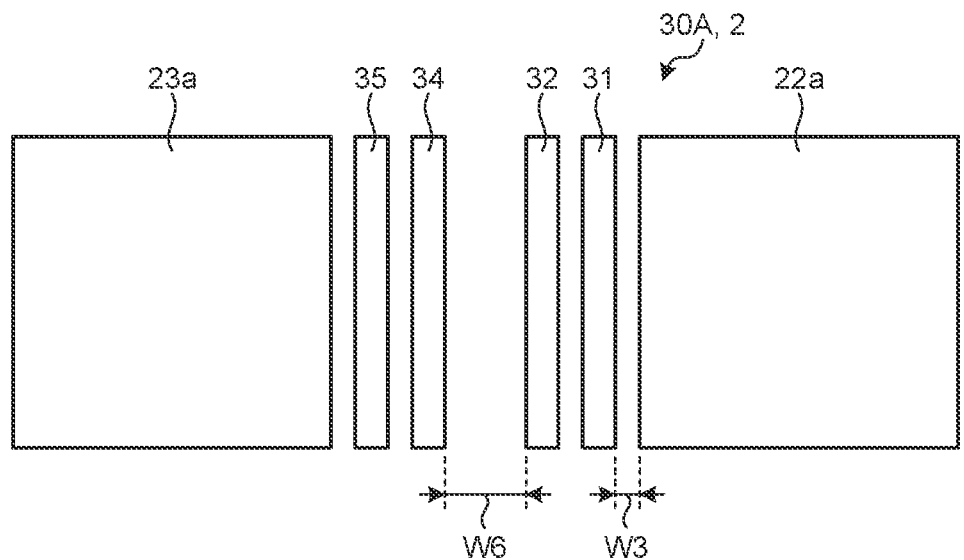
FIG. 12 is a plan view of the auxiliary pads according to a first modification.

FIG. 12 is a plan view of the auxiliary pads according to a first modification. The array substrate 2 according to the first modification includes four auxiliary pads 30A. In other words, the auxiliary pads 30A are different from the auxiliary pads 30 according to the first embodiment in that they do not include the third auxiliary pad 33 (refer to FIG. 5).

A space W6 between the second auxiliary pad 32 and the fourth auxiliary pad 34 has such a length that the second auxiliary pad 32 and the fourth auxiliary pad 34 do not come into contact with each other if they are both crushed by the anode 3b or the cathode 3a across them. In other words, the space W6 is such a distance that the bulge 30a (refer to FIG. 6) formed on the second auxiliary pad 32 and the bulge 30a (refer to FIG. 6) formed on the fourth auxiliary pad 34 do not come into contact with each other. Specifically, the space W6 is longer than twice the first expansion amount W4 of the bulge 30a. This configuration prevents the second auxiliary pad 32 from being electrically coupled to the fourth auxiliary pad 34 and can reliably prevent a short circuit between the first pad 22a and the second pad 23a. If the anode 3b and the second pad 23a, for example, are bonded not by welding but by the anisotropic conductive film 40 (refer to FIG. 9), electrical insulation is secured if the space W6 is larger than the particle diameter of the metal particles 42.

Second Modification

Figure 13:
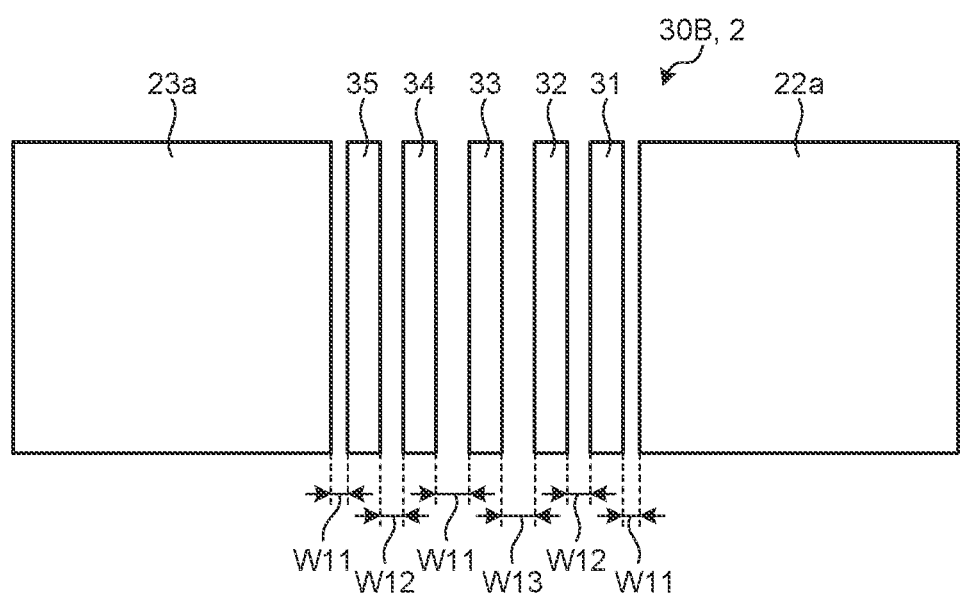
FIG. 13 is a plan view of the auxiliary pads according to a second modification.

FIG. 13 is a plan view of the auxiliary pads according to a second modification. Similarly to the first embodiment, the array substrate 2 according to the second modification includes five auxiliary pads 30B. Both the space between the first pad 22a and the first auxiliary pad 31 and the space between the second pad 23a and the fifth auxiliary pad 35 are W11. Both the space between the first auxiliary pad 31 and the second auxiliary pad 32 and the space between the fourth auxiliary pad 34 and the fifth auxiliary pad 35 are W12. Both the space between the second auxiliary pad 32 and the third auxiliary pad 33 and the space between the third auxiliary pad 33 and the fourth auxiliary pad 34 are W13. The distance increases in the order of the spaces W11, W12, and W13. Thus, the space increases toward the center in the first direction Dx in which the auxiliary pads 30B are arrayed. In other words, the auxiliary pads according to the present disclosure need not have a constant distance from the auxiliary pads 30 or the like disposed adjacently thereto.

Third Modification

Figure 14:
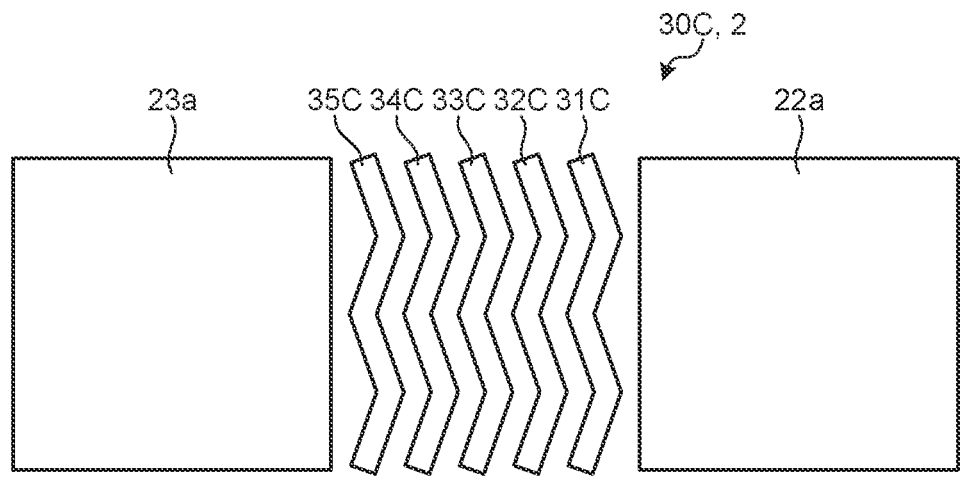
FIG. 14 is a plan view of the auxiliary pads according to a third modification.

FIG. 14 is a plan view of the auxiliary pads according to a third modification. The array substrate 2 according to the third modification includes five auxiliary pads 30C. A first auxiliary pad 31C, a second auxiliary pad 32C, a third auxiliary pad 33C, a fourth auxiliary pad 34C, and a fifth auxiliary pad 35C each have a wavy shape alternately protruding toward one side and the other side in the first direction Dx from one end to the other end in the second direction Dy. Thus, the auxiliary pads according to the present disclosure are not limited to rectangular pads and may have a shape corresponding to the shape of the ends of the first pad 22a and the second pad 23a.

Fourth Modification

Figure 15:
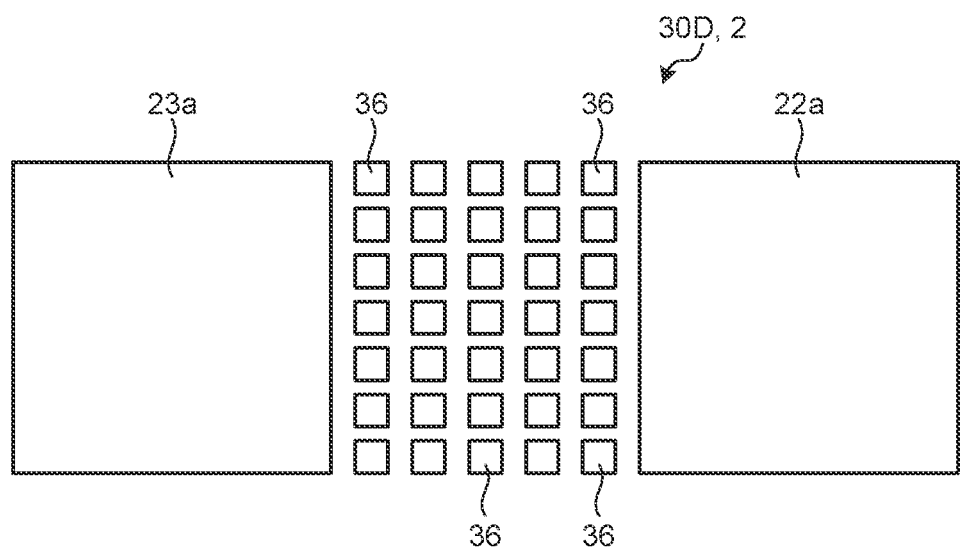
FIG. 15 is a plan view of the auxiliary pads according to a fourth modification.

FIG. 15 is a plan view of the auxiliary pads according to a fourth modification. An auxiliary pad 30D of the array substrate 2 according to the fourth modification is a square auxiliary pad 36 that has a square shape in plan view. A plurality of the square auxiliary pads 36 are provided and are equally spaced in the first direction Dx and the second direction Dy. When crushed by the anode 3b or the cathode 3a, the square auxiliary pad 36 expands in the first direction Dx and the second direction Dy.

Fifth Modification

FIG. 16 is a plan view of the auxiliary pads according to a fifth modification. Auxiliary pads 30E of the array substrate 2 according to the fifth modification are composed of peripheral auxiliary pads 37a, 37b, 37c, and 37d surrounding the first pad 22a, and peripheral auxiliary pads 38a, 38b, 38c, and 38d surrounding the second pad 23a. The peripheral auxiliary pads 37a and 37c are separated from the first pad 22a and sandwich the first pad 22a in the first direction Dx. The peripheral auxiliary pads 37b and 37d are separated from the first pad 22a and sandwich the first pad 22a in the second direction Dy. The peripheral auxiliary pads 38a and 38c are separated from the second pad 23a and sandwich the second pad 23a in the first direction Dx. The peripheral auxiliary pads 38b and 38d are separated from the second pad 23a and sandwich the second pad 23a in the second direction Dy. The anode 3b and the cathode 3a according to the embodiments and the other modifications described above come into contact with the auxiliary pads if they are misaligned between the first pad 22a and the second pad 23a. By contrast, the anode 3b and the cathode 3a according to the fifth modification can be electrically coupled to the first pad 22a and the second pad 23a if they are misaligned at a position other than between the first pad 22a and the second pad 23a.

Sixth Modification

FIG. 17 is a plan view of the auxiliary pads according to a sixth modification. Auxiliary pads 30F of the array substrate 2 according to the sixth modification are rectangular frame-shaped auxiliary pads 39 surrounding the first pad 22a and the second pad 23a. The frame-shaped auxiliary pads 39 can also achieve the same advantageous effects as those according to the fifth modification.

While the wiring substrate and the display device according to the embodiments and the modifications have been described above, an increase in electrical resistance of the coupling part can be suppressed by at least one auxiliary pad according to the present disclosure. Therefore, a wiring board and a display device provided with one auxiliary pad near the end of the first pad 22a (cathode pad) or the second pad 23a (anode pad) is also included in the wiring substrate and the display device according to the present disclosure.

What is claimed is:

1. A wiring substrate comprising:
   a substrate;
   an insulating film stacked on the substrate;
   an anode pad stacked on a first surface of the insulating film and electrically coupled to an anode of an inorganic light-emitting diode;
   a cathode pad stacked on the first surface of the insulating film and electrically coupled to a cathode of the inorganic light-emitting diode; and
   an auxiliary pad provided to the first surface of the insulating film and having electrical conductivity,
   wherein
   the auxiliary pad is disposed in a floating state near an end of the anode pad and the cathode pad,
   the auxiliary pad crushed, when being melted, by the anode or the cathode to expand in a planar direction parallel to the first surface of the insulating film, and an amount of expansion in the planar direction is a first expansion amount, and
   a distance between the auxiliary pad and the anode pad or the cathode pad disposed adjacently to the auxiliary pad in the planar direction and a distance between the auxiliary pad and another auxiliary pad disposed adjacently to the auxiliary pad in the planar direction are smaller than the first expansion amount.

2. The wiring substrate according to claim 1, wherein the auxiliary pad is long in an orthogonal direction orthogonal to a direction in which the anode pad and the cathode pad are disposed when viewed from a stacking direction in which the anode pad is stacked on the first surface of the insulating film, and
   a plurality of the auxiliary pads are arrayed between the anode pad and the cathode pad.

3. The wiring substrate according to claim 2, wherein the auxiliary pads are disposed at equal intervals in the direction in which the anode pad and the cathode pad are disposed.

4. A display device comprising:
   the wiring substrate according to claim 2; and
   the inorganic light-emitting diode, which is bonded by pressing the anode and the cathode against the anode pad and the cathode pad that are melted, wherein
   the auxiliary pad has a bulge coupled to the anode pad or the cathode pad disposed adjacently to the auxiliary pad in the planar direction or coupled to another auxiliary pad disposed adjacently to the auxiliary pad in the planar direction.

5. A wiring substrate comprising:
   a substrate;
   an insulating film stacked on the substrate;
   an anode pad stacked on a first surface of the insulating film and electrically coupled to an anode of an inorganic light-emitting diode;
   a cathode pad stacked on the first surface of the insulating film and electrically coupled to a cathode of the inorganic light-emitting diode; and
   an auxiliary pad provided to the first surface of the insulating film and having electrical conductivity,
   wherein
   the auxiliary pad is disposed in a floating state near an end of the anode pad and the cathode pad,
   a distance between the auxiliary pad and the anode pad or the cathode pad disposed adjacently to the auxiliary pad in a planar direction parallel to the first surface of the insulating film and a distance between the auxiliary pad and another auxiliary pad disposed adjacently to the auxiliary pad in the planar direction are smaller than the particle diameter of a metal particle included in an anisotropic conductive film.

6. The wiring substrate according to claim 5, wherein the auxiliary pad is long in an orthogonal direction orthogonal to a direction in which the anode pad and the cathode pad are disposed when viewed from a stacking direction in which the anode pad is stacked on the first surface of the insulating film, and
   a plurality of the auxiliary pads are arrayed between the anode pad and the cathode pad.

7. The wiring substrate according to claim 6, wherein the auxiliary pads are disposed at equal intervals in the direction in which the anode pad and the cathode pad are disposed.

8. A display device comprising:
   the wiring substrate according to claim 3;
   an anisotropic conductive film including a plurality of metal particles and stacked over the anode pad, the cathode pad, and the auxiliary pad; and
   the anode of the inorganic light-emitting diode, which is bonded by pressing the anode and the cathode against the anisotropic conductive film that is melted, wherein
   the inorganic light-emitting diode is electrically coupled to the anode pad, the cathode pad, and the auxiliary pad via the metal particles, and
   the auxiliary pad is electrically coupled to the anode pad and the cathode pad via the metal particles.

9. A wiring substrate comprising:
   a substrate;
   an insulating film stacked on the substrate;
   an anode pad stacked on a first surface of the insulating film and electrically coupled to an anode of an inorganic light-emitting diode;
   a cathode pad stacked on the first surface of the insulating film and electrically coupled to a cathode of the inorganic light-emitting diode; and
   an auxiliary pad provided to the first surface of the insulating film and having electrical conductivity,
   wherein
   the auxiliary pad is disposed in a floating state near an end of the anode pad and the cathode pad,
   the auxiliary pad is long in an orthogonal direction orthogonal to a direction in which the anode pad and the cathode pad are disposed when viewed from a stacking direction in which the anode pad is stacked on the first surface of the insulating film, and
   a plurality of the auxiliary pads are arrayed between the anode pad and the cathode pad.

10. The wiring substrate according to claim 9, wherein the auxiliary pads are disposed at equal intervals in the direction in which the anode pad and the cathode pad are disposed.

* * * * *